United States Patent
Matsumoto et al.

(10) Patent No.: US 9,735,803 B2
(45) Date of Patent: Aug. 15, 2017

(54) DATA COMPRESSION DEVICE AND DATA COMPRESSION METHOD

(71) Applicant: MITSUBISHI ELECTRIC CORPORATION, Tokyo (JP)

(72) Inventors: Wataru Matsumoto, Tokyo (JP); Takashi Yamazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/119,155

(22) PCT Filed: Mar. 5, 2014

(86) PCT No.: PCT/JP2014/055671
§ 371 (c)(1),
(2) Date: Aug. 16, 2016

(87) PCT Pub. No.: WO2015/132914
PCT Pub. Date: Sep. 11, 2015

(65) Prior Publication Data
US 2017/0019125 A1  Jan. 19, 2017

(51) Int. Cl.
*H03M 7/34* (2006.01)
*H03M 7/30* (2006.01)
*H03M 13/11* (2006.01)
*G06K 9/46* (2006.01)

(52) U.S. Cl.
CPC .......... *H03M 7/3082* (2013.01); *H03M 7/30* (2013.01); *G06K 9/4671* (2013.01); *H03M 13/1102* (2013.01)

(58) Field of Classification Search
CPC .................................. H03M 7/3082
USPC ....................................................... 341/50–75
See application file for complete search history.

(56) References Cited

U.S. PATENT DOCUMENTS

| 5,490,258 A * | 2/1996 | Fenner ............... H03M 7/4006 707/999.001 |
| 5,635,932 A * | 6/1997 | Shinagawa ............. G06T 9/005 341/51 |
| 5,729,223 A * | 3/1998 | Trissel ................ H03M 7/3084 341/51 |
| 5,940,824 A | 8/1999 | Takahashi |
| 6,574,275 B1 * | 6/2003 | Katayama .............. H04N 19/61 375/240.05 |
| 7,840,072 B2 * | 11/2010 | Kumar ...................... G06F 7/02 382/128 |

(Continued)

FOREIGN PATENT DOCUMENTS

| JP | H8-221113 A | 8/1996 |
| JP | H8-305718 A | 11/1996 |

(Continued)

OTHER PUBLICATIONS

Li et al., "Quantized Embeddings of Scale-Invariant Image Features for Mobile Augmented Reality", Multimedia Signal Processing (MMSP), 2012 IEEE.

*Primary Examiner* — Lam T Mai
(74) *Attorney, Agent, or Firm* — Birch, Stewart, Kolasch & Birch, LLP (57) ABSTRACT

A dimensional compression unit 13 multiplies a feature quantity extracted from an image by a check matrix of an error correcting code which consists of binary elements each of which is 0 or 1, to compress the image.

3 Claims, 4 Drawing Sheets (56) References Cited

U.S. PATENT DOCUMENTS

| | | | |
|---|---|---|---|
| 9,432,298 B1* | 8/2016 | Smith | H04L 49/9057 |
| 2002/0024525 A1* | 2/2002 | Ushida | G06T 9/004 |
| | | | 345/555 |
| 2010/0235415 A1 | 9/2010 | Ikada | |
| 2017/0006290 A1* | 1/2017 | Osawa | H04N 19/176 |

FOREIGN PATENT DOCUMENTS

| | | |
|---|---|---|
| JP | 2003-124815 A | 4/2003 |
| JP | 2003-204316 A | 7/2003 |
| JP | 2006-217363 A | 8/2006 |
| JP | 2008-276695 A | 11/2008 |
| JP | 2010-213230 A | 9/2010 |
| JP | 2011-77958 A | 4/2011 |
| JP | 2012-015652 A | 1/2012 |

\* cited by examiner

DATA COMPRESSION DEVICE AND DATA COMPRESSION METHOD

FIELD OF THE INVENTION

The present invention relates to a data compression device for and a data compression method of compressing data to data having a shorter length.

BACKGROUND OF THE INVENTION

Data about an image, a voice, a sensor, etc. or feature quantities extracted from the data are multiplied by a matrix having random numbers as its elements, so as to generate compressed data. The number of elements of data which is subjected to dimensional compression is called dimensionality. In conventional dimensional compression, the elements of an m×n matrix are set to real values, and the matrix is constructed by using values selected at random as the elements. n is the dimensionality of original data and m is the dimensionality of the data after compression. Further, n≥m.

By compressing data about an image, a voice, a sensor, etc. or feature quantities of the data in the above-mentioned way, the amount of data to be processed which are associated with a search, recognition, prediction, or the like is reduced and a speedup is implemented, so that a single operation can be processed in a short time and many operations or a more-complicated operation can be implemented within a certain fixed time period.

Figure 4:
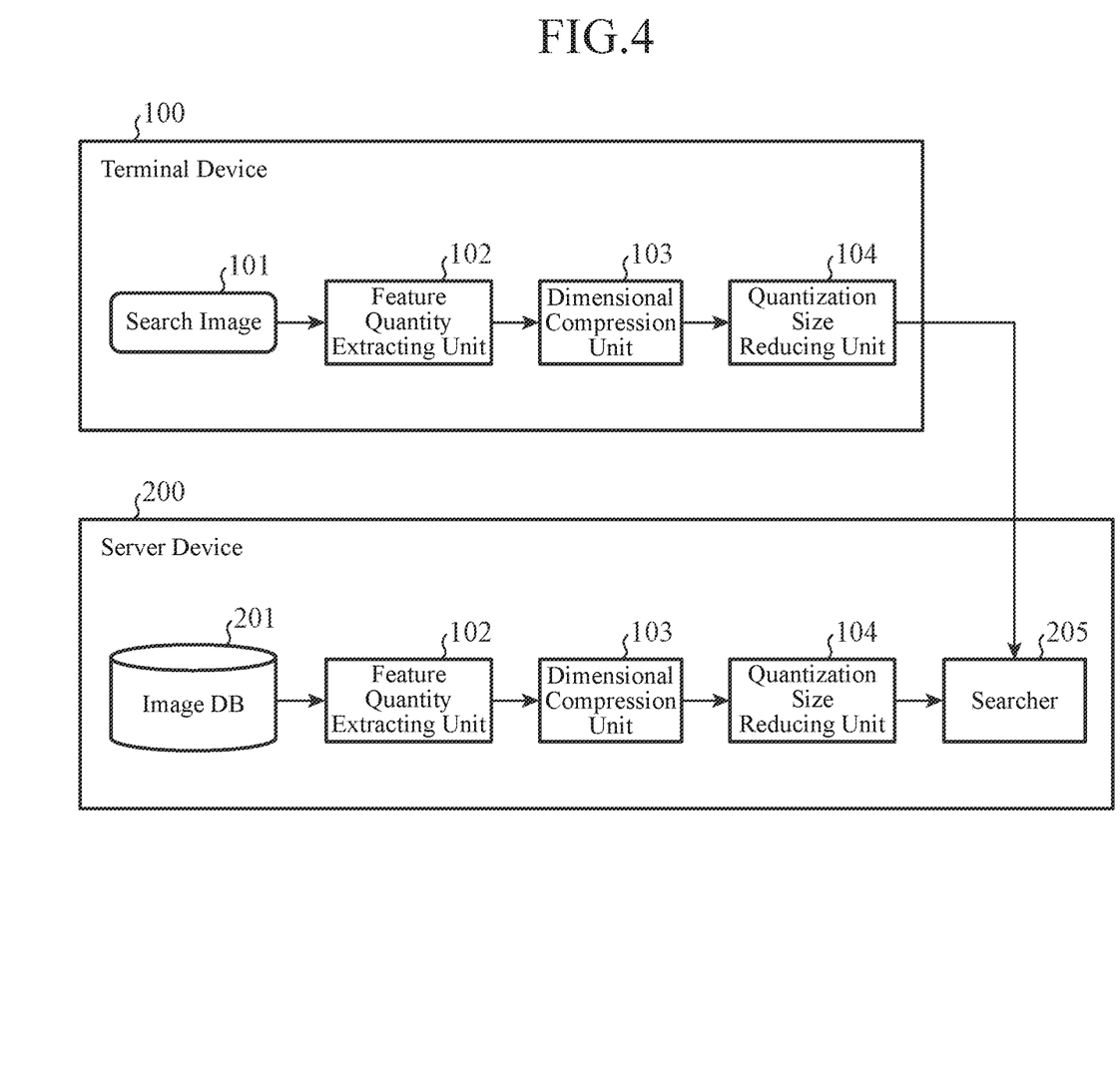
FIG. 4 is a block diagram showing the configuration of an image matching system which employs a conventional data compression method.

For example, an image matching system shown in FIG. 4 searches for an image close to a photo (search image 101) captured by a terminal device 100, or the like from among many sample images held by an image database (referred to as DB from here on) 201 of a server device 200. In this system, a feature quantity extracting unit 102 of the terminal device 100 extracts feature quantities from the search image 101. When SIFT (Scale-Invariant Feature Transform) is used for the feature quantity extraction, a plurality of 128-byte feature quantity vectors (typically, several tens to hundreds of feature quantity vectors) are extracted per image.

A conventional dimensional compression unit 103 performs dimensional compression on the above-mentioned feature quantities by using a random projection matrix. The random projection matrix used at that time is given by equation (1), and the elements a(r, c) of the random projection matrix are a(r, c) to N (0, 1) and are pursuant to a normal distribution having an average of 0 and a variance of 1.

$$A \in R^{m \times n} \quad (1)$$

When the feature quantities are expressed by $x=(x_1, x_2, \ldots, x_n)$, the feature quantities $y=(y_1, y_2, \ldots, y_m)$ after compression are calculated according to $y^T = Ax^T$. "T" of $y^T$ and $x^T$ means transposition.

When SIFT is used as mentioned above, each element $x_i$ of the feature quantity vector x is represented as 1 byte=8 bits, and the feature quantity vector is expressed as n=128. Further, when each element a(r, c) of the random projection matrix A is configured in such a way as to be able to be represented as 8 bits, each element $y_k$ of the feature quantity vector y after compression can be calculated according to equation (2).

$$y_k = x_1 \cdot a(k,1) + x_2 \cdot a(k, 2) + \ldots + x_i \cdot a(k,i) + \ldots + x_n \cdot a(k,n) \quad (2)$$

Therefore, because $128=2^7$ elements whose number is equal to the number of columns are added to 2 bytes=16 bits in the multiplication of the elements of the random projection matrix A and the elements of the feature quantity vector x, a maximum of 16+7=23 bits is the quantization size of each element $y_k$ of the feature quantity vector y after compression. The length of the feature quantity vector y after compression can be expressed as an m-dimensional vector, and the data can be compressed from 128 before compression to 40 when the dimension is set to m=40.

In addition, in nonpatent reference 1, a method of reducing the quantization size of each element $y_k$ of the feature vector y after compression is examined. For example, a method of compressing the size of each element $y_k$ from a maximum of 23 bits to about 1 to 5 bits in the above-mentioned example is shown. In this method, the dimensional compression is performed on the condition that the distance between feature quantities is maintained.

In the case in which the quantization size reducing unit 104 compresses the quantization size of feature quantities by using the method disclosed in above-mentioned nonpatent reference 1, when the amount of data in which each feature quantity has 128×8=1,024 bits is compressed to m=40 and the quantization size of 4 bits, the amount of data after compression is 128×40/128×4=160 bits and the amount of data is compressed to 160/1,024=15.6%.

Also in the server device 200, the feature quantity extracting unit 102 extracts feature quantities from each sample image stored the image DB 201, and the dimensional compression unit 103 and the quantization size reducing unit 104 compress the feature quantities.

For example, when the image DB 201 has 10,000 sample images, the server device 200 performs feature quantity extraction and data compression on each sample image, and the searcher 205 compares the compressed feature quantities of the search image 101, which are sent from the terminal device 100, with the image DB, to search for a sample image close to the search image 101.

RELATED ART DOCUMENT

Nonpatent Reference

Nonpatent reference 1: Mu Li, Shantanu Rane, Petros Boufounos, "Quantized Embeddings of Scale Invariant Image Features for Mobile Augmented Reality", Multimedia Signal Processing (MMSP), 2012 IEEE 14th International Workshop on Digital Object Identifier, pp. 1-6

SUMMARY OF THE INVENTION

Problems to be Solved by the Invention

A problem with the above-mentioned method is however that because m×n multiplications are needed when calculating $y^T$ for dimensional compression, the amount of data before compression is large, and, when the compression ratio is of the same degree, the amount of computation increases exponentially.

For example, in the case of n=128 and m=40, m×n=5,120 multiplications are needed, and in the case of n=1,280 and m=400, m×n=512,000 multiplications are needed. Thus, when the amount of data before compression increases by 10 times, the amount of computation increases by 100 times. Further, random selection of elements of the matrix results in variations in the properties of the data after compression, and the occurrence of a case in which the hit rate at the time of search decreases.

The present invention is made in order to solve the above-mentioned problems, and it is therefore an object of the present invention to provide a technique of reducing the amount of computation at the time of data compression.

Means for Solving the Problem

According to the present invention, there is provided a data compression device that, when compressing either data acquired from information and communication equipment, or a feature quantity of the data, generates compressed data used for performing a search, recognition or prediction by performing an arithmetic operation on the data or the feature quantity, and a check matrix.

According to the present invention, there is provided a data compression method of, when compressing either data acquired from information and communication equipment, or a feature quantity of the data, generating compressed data used for performing a search, recognition or prediction by performing an arithmetic operation on the data or the feature quantity, and a check matrix.

Advantages of the Invention

According to the present invention, because a check matrix is used as a random projection matrix when compressing data, the amount of computation can be reduced.

EMBODIMENTS OF THE INVENTION

Hereafter, in order to explain this invention in greater detail, the preferred embodiments of the present invention will be described with reference to the accompanying drawings.
Embodiment 1.

Figure 1:
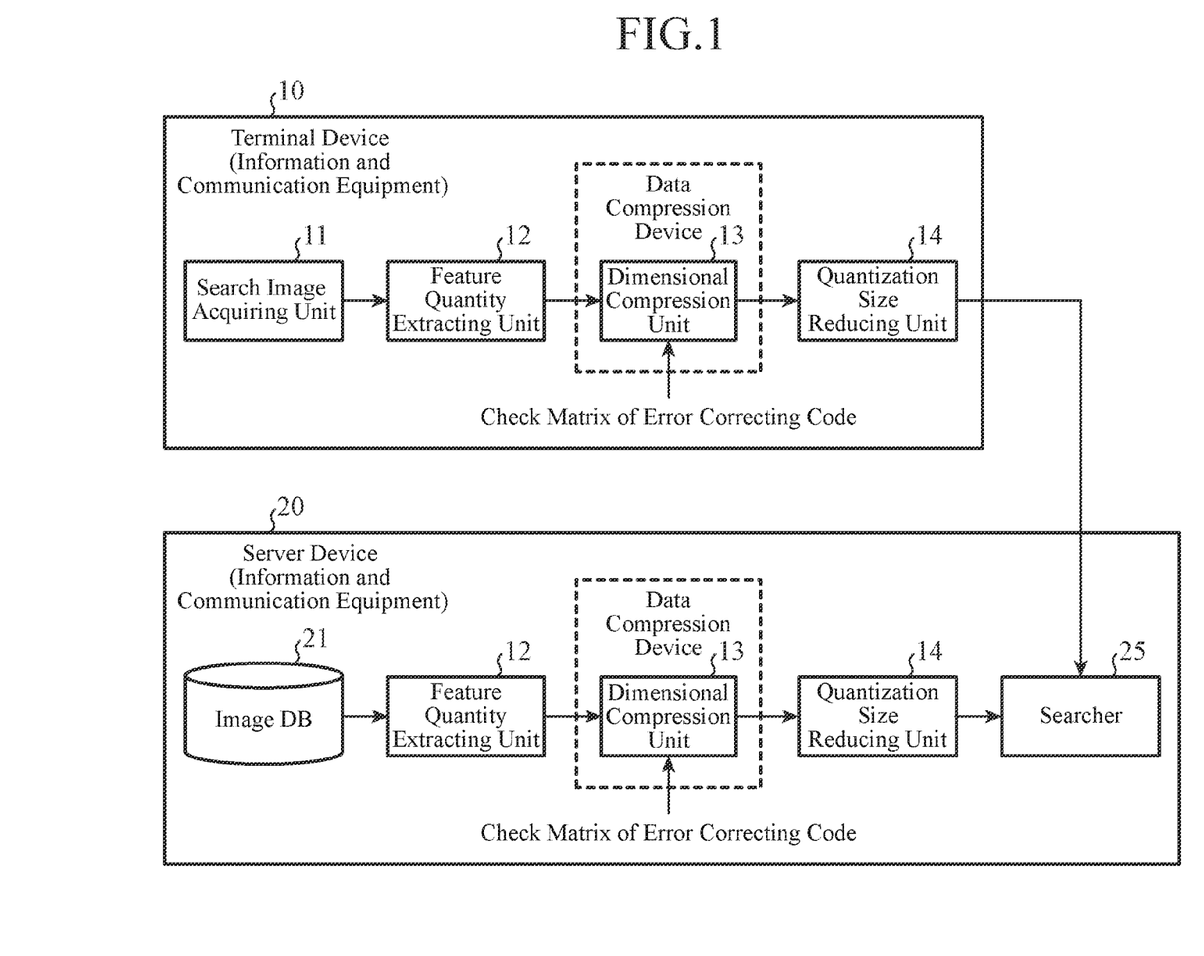
FIG. 1 is a block diagram showing the configurations of pieces of information and communication equipment into each of which a data compression device according to Embodiment 1 of the present invention is incorporated.

In Embodiment 1, a data compression method will be explained by providing, as an example, an image matching system configured using pieces of information and communication equipment (a terminal device 10 and a server device 20) into each of which a data compression device according to the present invention is incorporated, as shown in FIG. 1. The terminal device 10 is a tablet PC (Personal Computer), a smart phone, a monitoring camera, or the like, and includes a search image acquiring unit 11, a feature quantity extracting unit 12, a dimensional compression unit 13 (data compression device), and a quantization size reducing unit 14. The server device 20 that can communicate with this terminal device 10 includes an image DB 21, a feature quantity extracting unit 12, a dimensional compression unit 13 (data compression device), a quantization size reducing unit 14, and a searcher 25.

Each of the terminal device 10 and the server device 20 is comprised of a not-shown CPU (Central Processing Unit), and this CPU implements functions as the feature quantity extracting unit 12, the dimensional compression unit 13, the quantization size reducing unit 14 and the searcher 25 by executing a program stored in an internal memory. The dimensional compression unit 13 can be comprised of a dedicated operational circuit.

The image DB 21 is comprised of an HDD (Hard Disk Drive) or the like.

Figure 2:
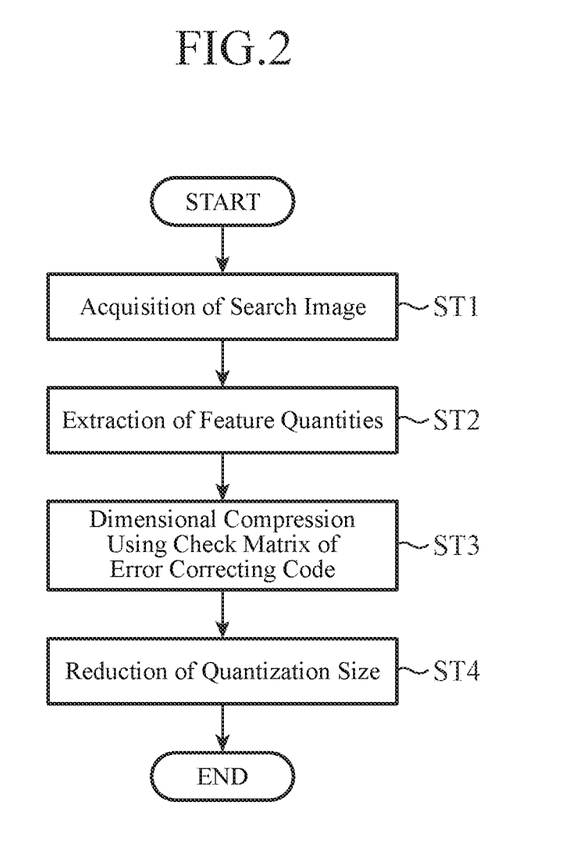
FIG. 2 is a flow chart showing the operations of the pieces of information and communication equipment into each of which the data compression device according to Embodiment 1 of the present invention is incorporated.

Next, the details of the terminal device 10 will be explained while referring to a flow chart shown in FIG. 2.

In the terminal device 10, the search image acquiring unit 11 captures an image received from a camera or the like as a search image which is a target for matching, and outputs the image to the feature quantity extracting unit 12 (step ST1).

The feature quantity extracting unit 12 extracts features of the detected image, and outputs the features to the dimensional compression unit 13 (step ST2). Although there are many examples of application of SIFT or the like, as a method of extracting feature quantities, any type of feature quantity extracting method can be used. For example, in the case of SIFT, several tens to hundreds of characteristic points (referred to as key points) in the image are selected, and a 128-byte feature quantity vector is outputted for each of the key points. In this embodiment, it is assumed that the dimension of this 128-byte feature quantity vector is 128, and the feature quantity vector is a 128-dimensional vector.

The dimensional compression unit 13 performs dimensional compression on the feature quantity vector outputted by the feature quantity extracting unit 12 by using a check matrix of an error correcting code (step ST3). It is assumed that the check matrix of an error correcting code, which is used in this embodiment, is a matrix having a binary element $\{0, 1\}$ as each element, and is given by equation (11). The check matrix of an error correcting code can be alternatively a matrix having a non-binary element as each element, as shown in equation (12).

In the following explanation, it is assumed that as the check matrix of an error correcting code, a check matrix of a random code having a binary element $\{0, 1\}$ as each element, as shown in the equation (11), is used.

$$H \in F_2^{m \times n} \tag{11}$$

$$H \in F_p^{m \times n} \tag{12}$$

where p is a natural number other than two.

When the feature quantities extracted by the feature quantity extracting unit 12 are expressed by $x=(x_1, x_2, \ldots, x_n)$ the feature quantities on which the dimensional compression is performed by the dimensional compression unit 13 are calculated according to $y=(y_1, y_2, \ldots, y_m)=Hx$.

In the case in which the feature quantity extracting unit 12 uses SIFT, each element $x_i$ of the feature quantity vector x can be represented as 1 byte=8 bits, and the feature quantity vector can be expressed as n=128. Further, each element h(r, c) of the check matrix H can be represented as 1 bit, and each element $y_k$ of the feature quantity vector y after compression can be calculated according to equation (13).

$$y_k = x_1 \cdot h(k,1) + x_2 \cdot h(k,2) + \ldots + x_i \cdot h(k,i) + \ldots + x_n \cdot h(k,n) \tag{13}$$

In the case in which the check matrix consists of binary elements, it is preferable that the calculation on parts at each of which the element is 0 is eliminated, and an addition of $x_i$ is performed on only each part at which 1 is set. Therefore, because $128=2^7$ additions at maximum, 128 being equal to the number of columns, are performed on the 8-bit elements of the feature quantity vector x, the maximum of 8+7=15 bits becomes the quantization size of each element $y_k$ of the feature quantity vector y after compression. Further, the length of the feature quantity vector y after compression can be expressed as an m-dimensional vector, and can be compressed from 128 before compression to 40 when the dimension is set to m=40.

At that time, the difference between this embodiment and the conventional dimensional compression which does not use a check matrix of an error correcting code (the dimensional compression unit 103 of FIG. 4) is the amount of computation.

In the conventional configuration, because it is necessary to perform n multiplications and n−1 additions in order to calculate each element $y_k$ of the feature quantity vector y after compression, and it is necessary to repeat those calculations m times, m being the length of the feature quantity vector y, it is necessary to finally perform nm multiplications and (n−1)m additions.

In contrast, in Embodiment 1, because both the probability that each element of the check matrix H is 1 and the probability that each element of the check matrix H is 0 are ½ in the case of random coding, (n/2−1) additions on average are sufficient in order to calculate each element $y_k$, and, even if those calculations are repeated m times, m being the length of the feature quantity vector y, finally, (n/2−1)m additions on average are sufficient.

In the case of this example, nm=128×40=5,120 multiplications and (n−1)m=5,080 additions are needed in the conventional configuration. In contrast, in Embodiment 1, only (n/2−1)m=2,520 additions are sufficient, and a drastic reduction in the amount of computation can be achieved.

After that, the quantization size reducing unit 14 reduces the quantization size of each element $y_k$ of the feature quantity vector y after compression, to compress the quantization size from the maximum of 15 bits to about 1 to 5 bits, like in the case of above-mentioned nonpatent reference (step ST4). At that time, an evaluation is performed in advance in such a way that a large and small relationship of the relative distance between feature quantities can be maintained almost, and the compression dimension which can almost maintain the large and small relationship of the distance is determined.

Figure 3:
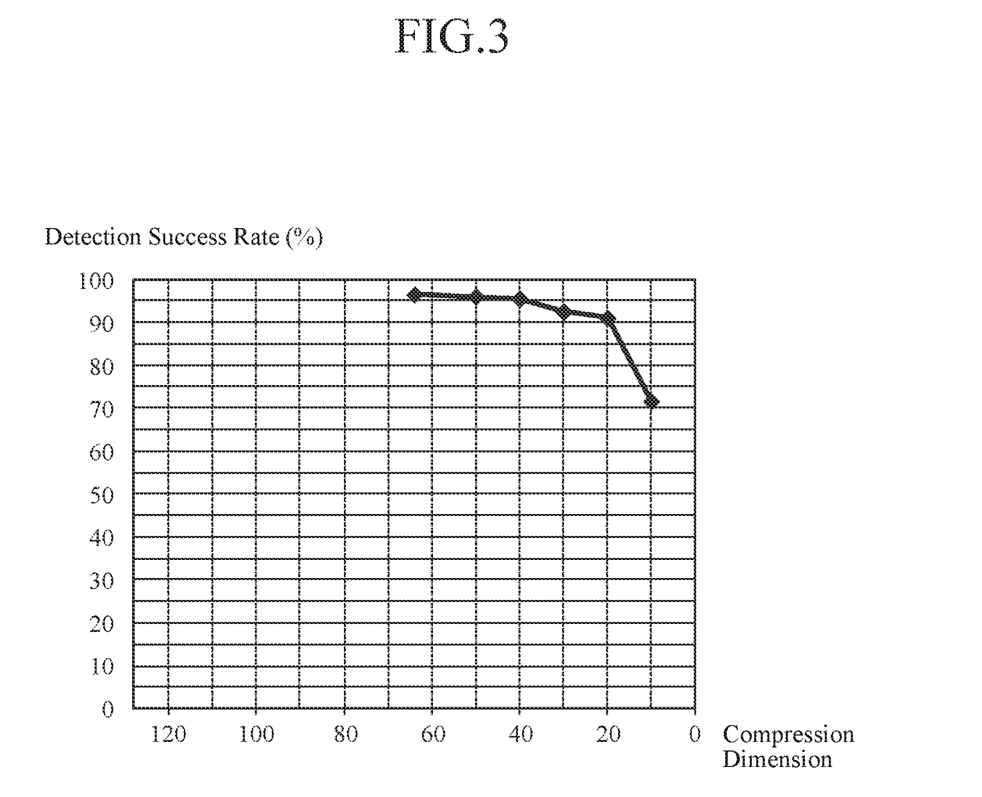
FIG. 3 is a graph for explaining a method of determining the compression dimension of a dimensional compression unit according to Embodiment 1.

Hereafter, an example of a determining method will be explained by using FIG. 3. The designer of the device prepares 800 (=200×4) photos which were acquired by shooting each of 200 types of buildings from four different angles, and assigns an identical ID number to the photos of the same building. Further, as a target, there is prepared a photo (different from the 800 photos mentioned above) which is acquired by shooting one of the 200 types of the buildings. Then, according to a k-nearest neighbor algorithm (a method of extracting k data which are the closest to the target and performing a majority decision), a photo in which the building which is the closest to the building of the target is photographed is detected from among the 800 photos. FIG. 3 shows results of the detection, and the vertical axis shows the detection success rate and the horizontal axis shows the compression dimension. k is set to 10, and the distance between the feature quantities of the building of the target and the feature quantities of the building of each of the 800 photos is compared, and a case in which the ID number whose distance to the feature quantities of an identical building is shorter has a majority in the k=10 data is determined to be a detection success. When the target performance is set to 95% of detection success rate, 40 can be selected as the dimension after compression. The compression dimension which is determined by using this method or the like is set to the dimensional compression unit 13 in advance.

When the amount of original data in which each feature quantity has 128×8=1,024 bits is compressed to m=40 and the quantization size of 4 bits, the amount of data after compression is 128×40/128×4=160 bits and therefore the amount of data can be compressed to 160/1,024=15.6%. The above-mentioned method is the one of compressing data for use in the terminal device 10.

Although in the above-mentioned explanation the example of compressing the feature quantities of a search image is shown, the search image itself can be compressed.

Also in the server device 20, the feature quantity extracting unit 12 extracts feature quantities from each sample image stored in the image DB 21 by using the same method as that mentioned above, the dimensional compression unit 13 performs dimensional compression using a check matrix of an error correcting code by using the same method as that mentioned above, and the quantization size reducing unit 14 reduces the quantization size by using the same method as that mentioned above. At that time, also in the server device 20, the same amount of computation as that in the terminal device 10 can be reduced at the time of computations for the dimensional compression.

For example, when the image DB 21 has 10,000 sample images, the feature quantity extracting unit 12, the dimensional compression unit 13 and the quantization size reducing unit 14 perform feature quantity extraction and data compression on each of the sample images, and output compressed feature quantities to the searcher 25.

The searcher 25 compares the compressed feature quantities of the search image sent from the terminal device 10 with the compressed feature quantities of each sample image inputted from the quantization size reducing unit 14, to search for a sample image close to the search image.

Because in the compression performed by the dimensional compression unit 13, a large and small relationship of the relative distance between feature quantities is maintained almost, the searcher 25 can determine which one of the sample images stored in the image DB 21 is close to the search image from the terminal device 10 by using a method such as a k-nearest neighbor algorithm (a method of extracting k data which are the closest to the target and performing a majority decision). As a result, there are provided characteristics of being able to suppress the degradation of the hit rate due to the compression.

In this case, because the search target of the k-nearest neighbor algorithm is the compressed feature quantities, the processing time can be shortened to 15.6% in the search using simple comparisons.

As mentioned above, according to Embodiment 1, because the dimensional compression unit 13 multiplies data or feature quantities extracted from the data by a check matrix of an error correcting code to generate compressed data, the amount of computation can be reduced.

Particularly, by using, as the check matrix of an error correcting code, a check matrix of a random code which consists of binary elements each of which is 0 or 1, the amount of computation for the compression can be reduced from nm multiplications and (n−1)m additions at the time of using a conventional random projection matrix to only (n/2−1)m additions.

Embodiment 2.

A data compression device according to Embodiment 2 will be explained by using the image matching system shown in FIG. 1.

In this Embodiment 2, it is assumed that, as a check matrix of an error correcting code which a dimensional compression unit 13 (data compression device) uses for dimensional compression, a check matrix of an LDPC (Low-Density Parity-Check) code which consists of binary elements {0, 1} is used as shown in the above-described equation (11).

Although an explanation will be omitted hereafter, a check matrix of an LDPC code which consists of non-binary elements can be alternatively used as shown in the above-described equation (12).

In an LDPC code, an average column weight is typically 4 and an average row weight is (the average column weight)×n/m. The column weight is the number of is included in each column of the matrix. Further, the row weight is the number of is included in each row of the matrix. For example, in the case of n=128 and m=40, the row weight is 4×128/40=12.8. An LDPC code have characteristics that those column and row weights do not change even if n or m becomes large.

In the case of a check matrix of a random code explained in above-mentioned Embodiment 1, the number of is in each column is n/2 on average and the number of is in each row is m/2 on average, and therefore the numbers of is in both columns and rows are large as compared with a check matrix of an LDPC code and the total number of is within the matrix also increases because this total number is squared. In contrast, in the case of a check matrix of an LDPC code, because the number of 1 s is constant at all times and is are sparse, the total number of is decreases overwhelmingly as compared with that in the case of a check matrix of a random code.

For example, in the case of n=128 and m=40, in a random code, the total number of 1 s is (the average column weight)×(the number of columns)=40/2×128=2,560. In contrast, in the case of an LDPC code, the total number of 1 s is (the average column weight)×(the number of columns)= 4×128=516, and is small overwhelmingly. Hereafter, as a concrete example, a check matrix H of an LDPC code in the case of n=28 and m=21 is shown in equation (14).

$$H = \begin{bmatrix} 1 & & & & & 1 & & & & & 1 & & & & & 1 & & & & & & & & & & & & \\ & 1 & & & & & 1 & & & & & 1 & & & & & 1 & & & & & & & & & & & \\ & & 1 & & & & & 1 & & & & & 1 & & & & & 1 & & & & & & & & & & \\ & & & 1 & & & & & 1 & & & & & 1 & & & & & 1 & & & & & & & & & \\ & & & & 1 & & & & & 1 & & & & & 1 & & & & & 1 & & & & & & & & \\ & & & & & 1 & & & & & 1 & & & & & 1 & & & & & 1 & & & & & & & \\ & & & & & & 1 & & & & & 1 & & & & & 1 & & & & & 1 & & & & & & \\ 1 & & & & & & & 1 & & & & & 1 & & & & & & & & & 1 & & & & & & \\ & 1 & & & & & & & 1 & & & & & 1 & & & & & & & & & 1 & & & & & \\ & & 1 & & & & & & & 1 & & & & & 1 & & & & & & & & & 1 & & & & \\ & & & 1 & & & & & & & 1 & & & & & 1 & & & & & & & & & 1 & & & \\ & & & & 1 & & & & & & & 1 & & & & & 1 & 1 & & & & & & & & & & \\ & & & & & 1 & & & & & & & 1 & 1 & & & & & 1 & & & & & & & & & \\ & & & & & & 1 & 1 & & & & & & & 1 & & & & & 1 & & & & & & & & \\ 1 & & & & & & & & 1 & & & & & & & 1 & & & & & & & & & 1 & & & \\ & 1 & & & & & & & & 1 & & & & & & & 1 & & & & & & & & & 1 & & \\ & & 1 & & & & & & & & 1 & & & & & & & 1 & 1 & & & & & & & & & \\ & & & 1 & & & & & & & & 1 & & & & & & & & 1 & 1 & & & & & & & \\ & & & & 1 & & & & & & & & 1 & 1 & & & & & & & 1 & & & & & & & \\ & & & & & 1 & & & & & & & & & 1 & & & & & 1 & & & & & & & 1 & \\ & & & & & & 1 & 1 & & & & & & & & 1 & & & & & & & & & & & & 1 \end{bmatrix} \quad (14)$$

Like in the case of above-mentioned Embodiment 1, each element h(r, c) of the check matrix H of an LDPC code can be represented as 1 bit, and each element $y_k$ of the feature quantity vector y after compression can be calculated according to the above-described equation (13).

Because it is preferable that the calculation on parts at each of which the element check matrix H of an LDPC code is 0 is eliminated, and an addition of $x_i$ is performed on only each part at which 1 is set, a needed number of additions of 4 bits in a binary expression of 24, the number being (the average column weight)×n/m=12.8 which is the row weight, are performed on the 1-byte=8-bit elements of the feature quantity vector x before compression, and the maximum of 8+4=12 bits becomes the quantization size of each element $y_k$ of the feature quantity vector y after compression. Further, the length of the feature quantity vector y after compression can be expressed as an m-dimensional vector, and can be compressed from 128 before compression to 40 when the dimension is set to m=40.

Further, in Embodiment 2, 12.8 additions on average, 12.8 being the row weight, are sufficient to calculate each element $y_k$, in this example, even if those additions are repeated m times, m being the length of feature quantity vector y, (12.8−1)×m=472 additions on average are sufficient. Therefore, a drastic reduction in the amount of computation can be achieved as compared with the amount of computation (nm=5,120 multiplications and (n−1)m=5,080 additions) at the time of using a conventional random projection matrix. Further, the amount of computation at the time of using the check matrix of an LDPC code is smaller than that at the time of using a check matrix of a random code.

As mentioned above, according to Embodiment 2, the dimensional compression unit 13 can reduce the amount of computation greatly by using a check matrix of a sparse LDPC code when compressing data or feature quantities extracted from the data. Further, because in the check matrix of an LDPC code its elements are arranged regularly, an advantage of suppressing variations in the compression performance can also be expected. In addition, because the compression efficiency increases with increase in the dimensionality n of the feature quantities before compression in the case of using the check matrix of an LDPC code, the check matrix of an LDPC code is effective particularly when handling feature quantities whose length is several hundreds or longer.

Although the example of using a check matrix of a random code is shown in above-mentioned Embodiment 1, and the example of using a check matrix of an LDPC code is shown in above-mentioned Embodiment 2, a BCH code, a Reed-Solomon code, a cyclic code, or the like can be alternatively used. These codes have characteristics of, when handling feature quantities having a short length, being able to perform compression while suppressing a reduction in the success rate. As an alternative, an error correcting code other than those listed above can be used, and an appropriate error correcting code can be applied according to conditions.

Further, although a matrix which consists of binary elements $\{0, 1\}$ is illustrated as the check matrix in above-mentioned Embodiments 1 and 2, a matrix which consists of ternary elements $\{-1, 0, 1\}$ can be alternatively used.

For example, there can be provided a matrix given by the following equation (15) in which in the matrix given by the above-described equation (14), each element of 0 is made to remain being 0, and each element of 1 is set to −1 or 1. When using the check matrix as shown in the equation (15), the dimensional compression unit 13 performs additions or subtractions on values, in the data or the feature quantities extracted from the data, corresponding to the elements of 1 or 1 of the check matrix on a row by row basis, to generate compressed data.

Because there is not a large difference in the amount of computation between the method of using, as the elements of the check matrix, binary elements $\{0, 1\}$ and the method of using, as the elements of the check matrix, ternary elements $\{-1, 0, 1\}$, it is preferable to perform a performance evaluation and select one of the methods which exhibits better performance.

$$H = \begin{bmatrix} 1 & & & & & & & -1 & & & & & 1 & & & & & & & -1 & & \\ & 1 & & & & & & & -1 & & & & & 1 & & & & & & & -1 & \\ & & 1 & & & & & & & -1 & & & & & 1 & & & & & & & -1 \\ & & & 1 & & & & & & & -1 & & & & & 1 & & & & & & -1 \\ & & & & 1 & & & & & & & -1 & & & & & 1 & & & & -1 & \\ & & & & & 1 & & & & & & & -1 & & & & & 1 & & & & -1 \\ & & & & & & 1 & & & & & & & -1 & & & & & 1 & & & -1 \\ 1 & & & & & & & -1 & & & & & & & & & 1 & & & & -1 & \\ & 1 & & & & & & & -1 & & & & & & & & & 1 & & & & -1 \\ & & 1 & & & & & & & -1 & & & & & & & 1 & & & & -1 & \\ & & & 1 & & & & & & & -1 & & & & & 1 & & & & & -1 & \\ & & & & 1 & & & & & & & -1 & & & & 1 & -1 & & & & & \\ & & & & & 1 & & & & & & -1 & 1 & & & & & & & -1 & & \\ & & & & & & 1 & -1 & & & & & & 1 & & & & & -1 & & & \\ 1 & & & & & & & & -1 & & & & & & & 1 & & & & & -1 & \\ & 1 & & & & & & & & -1 & & & & & & 1 & -1 & & & & & \\ & & 1 & & & & & & & & -1 & & & & & & 1 & -1 & & & & \\ & & & 1 & & & & & & & & -1 & 1 & & & & & & & -1 & & \\ & & & & 1 & & & & & & -1 & 1 & & & & & & & -1 & & & \\ & & & & & 1 & -1 & & & & & & 1 & & & & & & & & -1 & \\ & & & & & & 1 & -1 & & & & & & 1 & & & & & & -1 & & \end{bmatrix} \quad (15)$$

While the present invention has been described in its preferred embodiments, it is to be understood that, in addition to the above-mentioned embodiments, an arbitrary combination of the embodiments can be made, various changes can be made in an arbitrary component according to any one of the embodiments, and an arbitrary component according to any one of the embodiments can be omitted within the scope of the invention.

INDUSTRIAL APPLICABILITY

As mentioned above, because the data compression device according to the present invention compresses data by using a check matrix of an error correcting code, with a small amount of computation, the data compression device is suitable for use in a device such as a device that performs a process such as a search, recognition or prediction, at a high speed on the basis of data about an image, a voice, a sensor, or the like.

EXPLANATIONS OF REFERENCE NUMERALS

10, 100 terminal device, 11 search image acquiring unit, 12, 102 feature quantity extracting unit, 13, 103 dimensional compression unit (data compression device), 14, 104 quantization size reducing unit, 20, 200 server device, 21, 201 image DB, 25, 205 searcher, and 101 search image.

The invention claimed is:

1. A data compression device that compresses data used for performing a search, recognition or prediction, the data compression device comprising:
   a processor; and
   memory having stored therein program instructions which cause the processor to extract features of the data in the form of an n dimensional feature quantity vector x;

perform dimensional compression on the feature quantity vector x by multiplying the feature quantity vector x by a check matrix H of a random code, which consists of binary elements 0 or 1, to generate a compressed m dimensional feature quantity vector y, where n>m; and reduce a quantization size of each element $y_k$ of the compressed feature quantity vector y, wherein said dimensional compression adds values, in said feature quantity vector x corresponding to 1 elements of said check matrix on a row by row basis, to generate the compressed feature quantity vector y.

2. A data compression device that compresses data used for performing a search, recognition or prediction, the data compression device comprising:

a processor; and memory having stored therein program instructions which cause the processor to extract features of the data in the form of an n dimensional feature quantity vector x; and perform dimensional compression on the feature quantity vector x by multiplying the feature quantity vector x by a check matrix H which consists of ternary elements 0, 1 or −1 to generate a compressed m dimensional feature quantity vector y, where n>m, wherein said dimensional compression adds or subtracts values, in said feature quantity vector x corresponding to 1 or −1 elements of said check matrix on a row by row basis, to generate the compressed feature quantity vector.

3. A data compression method of compressing data used for performing a search, recognition or prediction, the method comprising:

extracting, using a processor, features of the data in the form of an n dimensional feature quantity vector x;

performing, using a processor, dimensional compression on the feature quantity vector x by multiplying the feature quantity vector x by a check matrix which consists of binary elements 0 or 1 to generate a compressed m dimensional feature quantity vector y, where n>m; and reducing, processor, a quantization size of each element $y_k$ of the compressed feature quantity vector y, wherein said dimensional compression adds or subtracts values, in said feature quantity vector x corresponding to 1 or −1 elements of said check matrix on a row by row basis, to generate the compressed feature quantity vector.

* * * * *

UNITED STATES PATENT AND TRADEMARK OFFICE
CERTIFICATE OF CORRECTION

PATENT NO. : 9,735,803 B2  
APPLICATION NO. : 15/119155  
DATED : August 15, 2017  
INVENTOR(S) : Wataru Matsumoto et al.

It is certified that error appears in the above-identified patent and that said Letters Patent is hereby corrected as shown below:

In the Claims

Claim 3, at Column 12, Line 19, change "reducing, processor, a quantization" to --reducing, using a processor, a quantization--.

Signed and Sealed this  
Nineteenth Day of December, 2017

Joseph Matal  
*Performing the Functions and Duties of the*  
*Under Secretary of Commerce for Intellectual Property and*  
*Director of the United States Patent and Trademark Office*